(12) United States Patent
Kim

(10) Patent No.: US 8,008,857 B2
(45) Date of Patent: Aug. 30, 2011

(54) ORGANIC LIGHT EMITTING DISPLAY WITH REFLECTIVE ELECTRODE

(75) Inventor: Jong-Yun Kim, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 1111 days.

(21) Appl. No.: 11/811,721

(22) Filed: Jun. 11, 2007

(65) Prior Publication Data

US 2007/0295961 A1  Dec. 27, 2007

(30) Foreign Application Priority Data

Jun. 12, 2006  (KR) .................. 10-2006-0052645

(51) Int. Cl.
*H01L 21/82* (2006.01)
*H01L 21/00* (2006.01)
*G02F 1/1343* (2006.01)

(52) U.S. Cl. .......... 313/506; 313/498; 313/512; 445/24; 445/25

(58) Field of Classification Search .......... 313/495–512; 445/24–25
See application file for complete search history.

(56) References Cited

U.S. PATENT DOCUMENTS

| | | | | |
|---|---|---|---|---|
| 2005/0117104 A1* | 6/2005 | Nishida et al. | ................ | 349/141 |
| 2005/0176190 A1* | 8/2005 | Tomoda et al. | ................ | 438/166 |
| 2006/0065904 A1* | 3/2006 | Uemura et al. | ................ | 257/84 |
| 2006/0124940 A1* | 6/2006 | Miyazawa | ................ | 257/79 |
| 2006/0214573 A1* | 9/2006 | Maeda et al. | ................ | 313/506 |
| 2007/0145892 A1* | 6/2007 | Chen | ................ | 313/506 |

FOREIGN PATENT DOCUMENTS

| | | |
|---|---|---|
| JP | 2004-103488 | 4/2004 |
| JP | 2004-192890 | 7/2004 |
| KR | 10-2003-0058153 | 7/2003 |
| KR | 10-2004-0000630 A | 1/2004 |
| KR | 2004-0010367 | 1/2004 |
| KR | 10-2006-0001715 | 1/2006 |
| KR | 10-2006-0014778 | 2/2006 |
| KR | 10-2006-0054659 | 5/2006 |

* cited by examiner

*Primary Examiner* — Anne Hines
*Assistant Examiner* — Tracie Green
(74) *Attorney, Agent, or Firm* — Knobbe Martens Olson & Bear LLP

(57) ABSTRACT

An organic light emitting display is disclosed. One embodiment of the organic light emitting display includes a substrate member and a plurality of pixels that are formed on the substrate member. At least one of the pixels includes a thin film transistor, a light emitting element that is electrically connected to the thin film transistor, and a reflective layer that is disposed between the thin film transistor and the light emitting element and that is insulated from each of the thin film transistor and the light emitting element.

20 Claims, 2 Drawing Sheets

ORGANIC LIGHT EMITTING DISPLAY WITH REFLECTIVE ELECTRODE

CROSS-REFERENCE TO RELATED APPLICATIONS

This application claims priority to and the benefit of Korean Patent Application No. 10-2006-0052645 filed in the Korean Intellectual Property Office on Jun. 12, 2006, the entire content of which is incorporated herein by reference.

BACKGROUND

1. Field

The present disclosure relates to a display device, and particularly to an organic light emitting display device.

2. Description of the Related Technology

Recently, flat panel displays that have a light weight and a slim profile have drawn attention as next generation displays. Examples of such flat panel displays are a plasma display panel (PDP), a liquid crystal display (LCD), and an organic light emitting display.

Because organic light emitting displays are a self-light-emitting type which displays an image by inducing an organic compound to emit light, they have a wide viewing angle and high resolution, compared to other flat panel displays. Organic light emitting displays can be categorized into an active matrix (AM) type and a passive matrix (PM) type depending on the driving methods.

Organic light emitting displays include an array of pixels for displaying images. In the AM-type organic light emitting display, each pixel typically includes a light emitting unit configured to emit light and a circuit unit configured to drive the light emitting unit. Because of having diode characteristics, the light emitting unit is referred to as an organic light emitting diode (OLED). The light emitting unit includes an anode (hole injection electrode), a cathode (electron injection electrode), and an organic layer interposed therebetween.

The circuit unit typically includes two thin film transistors (TFTs) and one capacitor. One of the two thin film transistors serves as a switch for selecting the organic light emitting layer of a pixel to emit light among a plurality of pixels. The other thin film transistor serves as a driving element for applying a driving power source for driving the light emitting layer of a selected light emitting unit to emit light.

Certain organic light emitting displays are configured to emit light through the cathode(s) of the light emitting units. Such organic light emitting displays are generally referred to as a front light emitting type. In such organic light emitting displays, the anodes of light emitting units are connected to the drain electrodes of thin film transistors. Each of the anodes can be a single-layered reflective electrode or a multi-layered electrode including a reflective electrode.

A reflective electrode is typically formed using an etching process. In forming a reflective electrode, a reflective material is deposited and then is patterned to form isolated portions for individual pixels. Thus, a large portion of the deposited reflective material is etched away. During the etching process, many particles of the reflective material or impurities can be produced. Because the particles may remain and form dark portions in the reflective electrode, the organic light emitting display may have defects.

The above information disclosed in this Background section is only for furthering the understanding of the background of this disclosure and it may contain information that does not constitute the prior art.

SUMMARY

One embodiment provides an organic light emitting display including a substrate member and a plurality of pixels that are formed on the substrate member, wherein each pixel includes a thin film transistor, a light emitting element that is electrically connected to the thin film transistor, and a reflective layer that is disposed between the thin film transistor and the light emitting element and that is insulated from each of the thin film transistor and the light emitting element.

The reflective layer may have a penetration hole, and the thin film transistor and the light emitting element may be connected to each other through the penetration hole of the reflective layer. The reflective layer may cover substantially the entire surface of the substrate member except the penetration hole. The penetration hole of the reflective layer may be formed in a circular shape with a diameter of about 2 to about 20 µm. The penetration hole of the reflective layer may be formed in a quadrangular shape in which a length of one side is about 2 to about 20 µm. The reflective layer may be made of a material including silver (Ag).

The organic light emitting display may further include a planarization layer that is formed between the thin film transistor and the reflective layer, and an interlayer protective layer that is formed between the reflective layer and the light emitting element. The interlayer protective layer may have transmittance of about 80% or more. A thickness of the interlayer protective layer may be about 200 to about 2000 Å.

Another embodiment provides an organic light emitting display including: a substrate member; a gate electrode formed on the substrate member; an interlayer insulating layer that covers the gate electrode; a source electrode and a drain electrode that are formed on the interlayer insulating layer; a planarization layer that covers the source electrode and the drain electrode and that has a contact hole for exposing a part of the drain electrode; a reflective layer that has a penetration hole corresponding to the contact hole of the planarization layer and that is formed on the planarization layer; an interlayer protective layer that covers the reflective layer so that a part of a drain electrode is exposed through the contact hole of the planarization layer and a penetration hole of the reflective layer; a first electrode that is formed on the interlayer protective layer and that is connected to the drain electrode through the contact hole of the planarization layer and the penetration hole of the reflective layer; a pixel definition layer that is formed on the interlayer protective layer and that has an opening for exposing the first electrode; an organic layer that is formed on the first electrode within the opening; and a second electrode that is formed on the pixel definition layer and the organic layer.

The reflective layer may cover substantially the entire surface of the substrate member except the penetration hole. The penetration hole of the reflective layer may be formed in a circular shape with a diameter of about 2 to about 20 µm. The penetration hole of the reflective layer may be formed in a quadrangular shape in which a length of one side is about 2 to about 20 µm. The reflective layer may be made of a material including silver (Ag). The interlayer protective layer may have transmittance of about 80% or more. A thickness of the interlayer protective layer may be about 200 to about 2000 Å. Due to such a configuration, reflection efficiency of the organic light emitting display can improved and generation of a failure can be suppressed.

DETAILED DESCRIPTION

Figure 1:
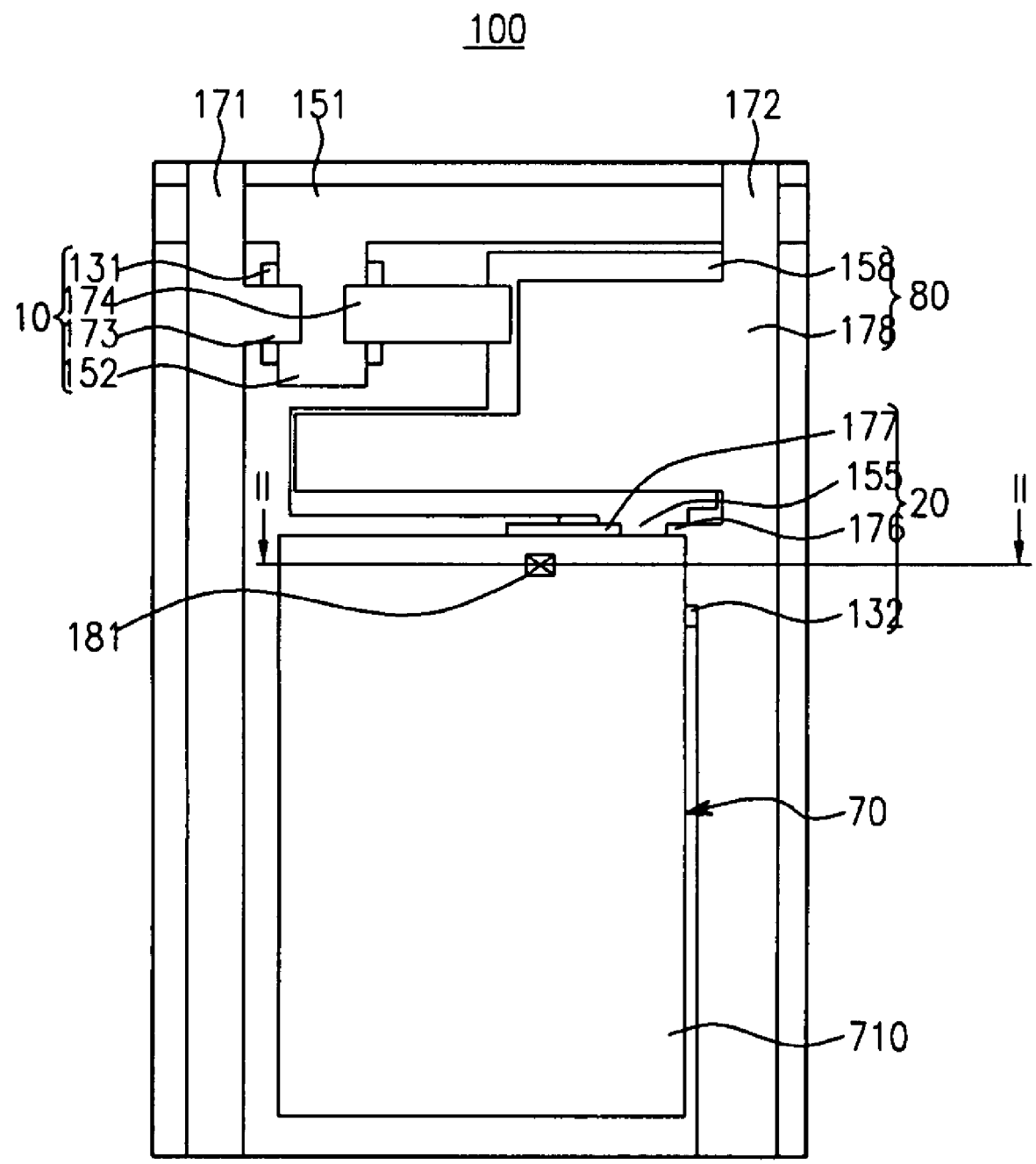
FIG. 1 is a top plan view of a portion of an organic light emitting display according to one embodiment.

Hereinafter, an organic light emitting display according to embodiments is described in detail with reference to the accompanying drawings. As those skilled in the art would realize, the described embodiments may be modified in various different ways, all without departing from the spirit or scope of the present invention.

In the accompanying drawings, an organic light emitting display including a thin film transistor having a PMOS structure is described. However, the present invention is not limited thereto. Various features of the present invention can be applied to a thin film transistor having an NMOS structure or a CMOS structure.

Further, in the accompanying drawings, a 2Tr-1Cap structure of an AM-type organic light emitting display having two TFTs and one capacitor in one pixel is described. However, the present invention is not limited thereto. Accordingly, the organic light emitting display can have three or more thin film transistors and two or more capacitors in one pixel, and may have various structures including separate wires.

The drawings and description are to be regarded as illustrative in nature and not limiting. Like reference numerals designate like elements throughout the specification. In the drawings, the thickness of layers, films, panels, regions, etc., are exaggerated for clarity. It will be understood that when an element such as a layer, film, region, or substrate is referred to as being "on" another element, it can be directly on the other element or at least one intervening element may be interposed between the elements. In contrast, when an element is referred to as being "directly on" another element, there are no intervening elements interposed therebetween.

Figure 2:
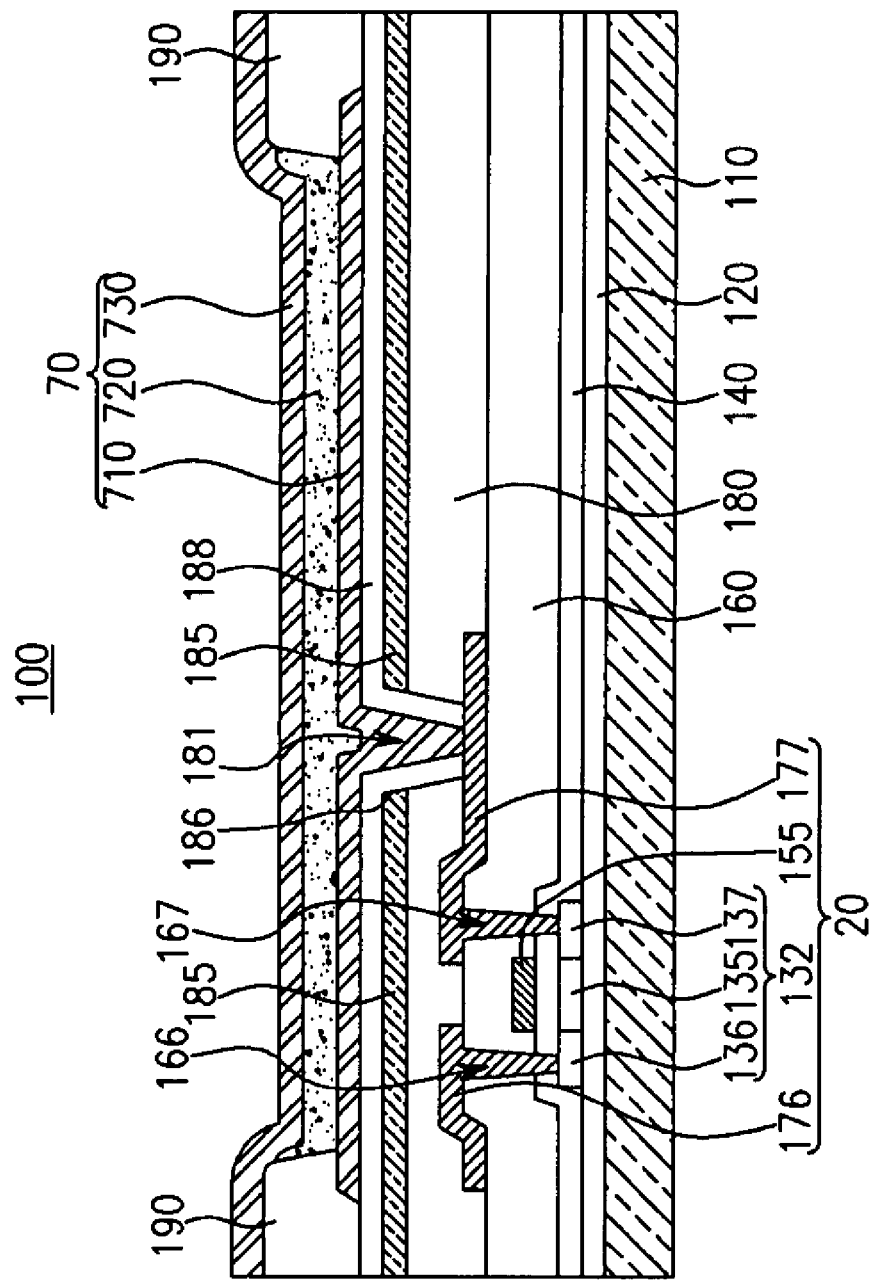
FIG. 2 is a cross-sectional view of the organic light emitting display, taken along the line II-II of FIG. 1.

FIG. 1 is a top plan view of a portion of an organic light emitting display according to one embodiment. FIG. 2 is a cross-sectional view, taken along line II-II of FIG. 1.

As shown in FIG. 1, the organic light emitting display 100 includes a first thin film transistor 10, a second thin film transistor 20, a capacitor 80, and a light emitting element 70 in one pixel. The organic light emitting display 100 further includes a gate line 151 that extends in the horizontal direction, and a data line 171 and a common power supply line 172 that extend in the vertical direction. The data line 171 and the common power supply line 172 intersect with and are insulated from the gate line 151.

The light emitting element 70 includes the OLED. The OLED includes an anode (hole injection electrode), a cathode (electron injection electrode), and an organic layer interposed therebetween.

After a hole and an electron from the anode and the cathode, respectively, are injected into the organic layer, an exciton is formed by the recombination of the injected hole and electron. The exciton drops from an exited state to a ground state, emitting light.

The capacitor 80 includes a first sustain electrode 158 and a second sustain electrode 178 with an insulator film interposed therebetween.

Each of the first thin film transistor 10 and the second thin film transistor 20 has a gate electrode 152, 155, a source electrode 173, 176, a drain electrode 174, 177, and a semiconductor layer 131, 132.

The first thin film transistor 10 serves as a switch for selecting a pixel to emit light. The first gate electrode 152 of the first thin film transistor 10 is electrically connected to the gate line 151. The first source electrode 173 is connected to the data line 171. The first drain electrode 174 is connected to the first sustain electrode 158 of the capacitor 80.

The second thin film transistor 20 serves to apply a driving power source to the anode for driving the organic layer of the selected light emitting element 70 to emit light. The second gate electrode 155 of the second thin film transistor 20 is connected to the first sustain electrode 158 of the capacitor 80. The second source electrode 176 is connected to the common power supply line 172.

The second drain electrode 177 of the second thin film transistor 20 is connected to a first electrode 710 of the light emitting element 70 through a contact hole 181 formed through planarization layers 180 (see FIG. 2). The first electrode 710 serves as an anode of the light emitting element 70. However, the present disclosure is not limited thereto. Accordingly, the first electrode 710 may be a cathode of the light emitting element 70 depending on the driving method of the organic light emitting display 100.

Further, referring to FIG. 2, a reflective layer 185 is formed under the first electrode 710 to be insulated from the first electrode 710. The reflective layer 185 has a penetration hole 186 (see FIG. 2) corresponding to the contact hole 181 of the planarization layer 180.

The illustrated reflective layer 185 is not partitioned for individual pixels while having the penetration holes 186 in the pixels. The reflective layer 185 may cover substantially the entire surfaces of the pixels. In other embodiments, the reflective layer may be formed across some pixels if not all the pixels.

In the illustrated structure, the first thin film transistor 10 is driven by a gate voltage applied to the gate line 151. The gate voltage serves to transfer a data voltage that is applied to the data line 171 to the second thin film transistor 20. A voltage corresponding to a difference between a common voltage (a voltage applied from the common power supply line 172 to the second thin film transistor 20) and a data voltage (a voltage transferred from the first thin film transistor 10) is stored in the capacitor 80. A current corresponding to the voltage stored in the capacitor 80 flows to the light emitting element 70 through the second thin film transistor 20 to drive the light emitting element 70 to emit light. In this case, because the reflective layer 185 covers substantially the entire surfaces of the pixels, the reflection efficiency of the organic light emitting display 100 can be improved.

Referring to FIG. 2, a structure of the organic light emitting display 100 according to one embodiment will be described in detail. FIG. 2 shows the second thin film transistor 20 and the light emitting element 70. The configuration of the first thin film transistor 10 is similar to that of the second thin film transistor 20, and therefore a detailed description thereof will be omitted.

As shown in FIG. 2, the organic light emitting display 100 includes a substrate member 110. The substrate member 110 may be formed of a metal (e.g., stainless steel) or an insulating material (e.g., glass, quartz, ceramic, plastic, and the like).

The organic light emitting display 100 may also include a buffer layer 120 formed on the substrate member 110. The buffer layer 120 is configured to prevent impurities from permeating. The buffer layer 120 also forms a planar surface. The buffer layer 120 can be formed of any material suitable for performing such a function. However, the buffer layer 120 is not always necessary, and may be omitted depending on the material and process conditions of the substrate member 110.

The semiconductor layer 132 is formed on the buffer layer 120. The semiconductor layer 132 can be formed of polysilicon. The semiconductor layer 132 includes a channel region 135 in which impurities are not doped, and a source region 136 and a drain region 137 that are doped with p+ at both sides of the channel region 135.

In this case, a doping ion material is a P-type impurity (e.g., boron). In one embodiment, $B_2H_6$ may be used as the doping ion material. The impurity may vary widely depending on the type of the thin film transistor.

A gate insulating layer 140 is formed on the semiconductor layer 132. The gate insulating layer 140 may be formed of silicon oxide or silicon nitride. A gate wire including the gate electrode 155 is formed on the gate insulating layer 140.

Although not shown in FIG. 2, the gate wire may further include the gate line 151 (see FIG. 1), the first sustain electrode 158 (see FIG. 1), and other wires to provide a voltage to the gate electrode 155. The gate electrode 155 is formed to overlie the channel region 135 of the semiconductor layer 132.

In the illustrated embodiment, the gate wire is formed in a single layer. In other embodiments, the gate wire can be formed in multiple layers. For example, the gate wire can include an upper layer and a lower layer. Aluminum or an aluminum alloy can be used for the lower layer. Molybdenum-tungsten or molybdenum-tungsten nitride can be used for the upper layer. If aluminum or an aluminum alloy having a low specific resistance is used for the lower layer, signal resistance due to wire resistance can be minimized or prevented. Further, molybdenum-tungsten or molybdenum-tungsten nitride has strong corrosion resistance against chemical agents. Thus, when used for the upper layer, molybdenum-tungsten or molybdenum-tungsten nitride can enhance the corrosion resistance of the gate wire against chemical agents, thus preventing the wire from breaking. In addition, such materials can prevent or minimize the oxidization of the gate wire. In other embodiments, molybdenum, aluminum, titanium, and tungsten can be used as wire materials.

An interlayer insulating layer 160 for covering the gate electrode 155 is formed on the gate insulating layer 140. The gate insulating layer 140 and the interlayer insulating layer 160 have contact holes 166 and 167 for exposing the source region 136 and the drain region 137 of the semiconductor layer 132. A contact hole for exposing the source region 136 is referred to as a first contact hole 166 in the context of this document. A contact hole for exposing the drain region 137 is referred to as a second contact hole 167 in the context of this document.

A data wire including the source electrode 176 and the drain electrode 177 is formed on the interlayer insulation layer 160. Although not shown in FIG. 2, the data wire may further include a data line 171 (see FIG. 1), a common power supply line 172 (see FIG. 1), a second sustain electrode 178 (see FIG. 1), and other wires for providing an electrical current to the source and drain electrodes 176, 177. The source electrode 176 and the drain electrode 177 are connected to the source region 136 and the drain region 137 of the semiconductor layer 132 through the first and second contact holes 166 and 167, respectively.

Similar to the gate wire, a data wire can be formed in multiple layers. The data wire can be formed of multiple materials to enhance the mechanical and/or electrical properties of the date wire.

Further, the configurations and positions of the gate wire and the data wire are not limited to those shown in the illustrated embodiment. Therefore, the configurations and positions of the gate wire and the data wire can vary widely depending on the structure of the thin film transistors 10 and 20 and other circuit wires. That is, at least one of a gate line, a data line, a common power supply line, and other elements may be formed at a level different from that of the illustrated embodiment.

The thin film transistor 20 including the semiconductor layer 132, the gate electrode 155, the source electrode 176, and the drain electrode 177 is formed as described above. Then, a planarization layer 180 for covering the data wires 176 and 177 is formed on the interlayer insulating layer 160. The planarization layer 180 removes steps formed by the underlying structure, and provides a planar surface on which the light emitting element 70 will be formed. The planarization layer 180 may enhance the luminous efficiency of the light emitting element 70.

Further, the planarization layer 180 has a contact hole 181 for exposing a part of the drain electrode 177. The contact hole 181 for exposing a part of the drain electrode 177 is referred to as a third contact hole in the context of this document.

The reflective layer 185 is formed on the planarization layer 180. The reflective layer 185 may be formed of a reflective material such as silver (Ag). The reflective layer 185 has a penetration hole 186 formed over the third contact hole 181 of the planarization layer 180. The penetration hole 186 may be formed in each pixel. The reflective layer 185 may be formed to cover a plurality of pixels without being partitioned. In another embodiment, the reflective layer 185 may be formed substantially across the display region of the organic light emitting display. In yet another embodiment, the reflective layer 185 can be formed over substantially the entire portion of the substrate member 110.

As described above, the reflective layer 185 is not partitioned for individual pixels. The reflective layer 185 can cover substantially the entire portion of the substrate member 110 without a break. Only the penetration hole 186 may need to be formed in the reflective layer 185 by a photolithography and etching process.

Therefore, in forming the reflective layer 185, an etched portion of the reflective layer 185 can be minimized. Therefore, an amount of impurities produced during the reflective layer etching process can be minimized. This allows minimizing dark portions in the reflective layer 185 due to impurities, thereby improving reflection efficiency. Further, because an area which the reflective layer 185 covers increases, the reflection efficiency can be further improved.

An interlayer protective layer 188 is formed on the reflective layer 185. The interlayer protective layer 188 covers the reflective layer 185 such that that the drain electrode 177 is exposed through the third contact hole 181 of the planarization layer 180 and the penetration hole 186 of the reflective layer 185. In some embodiments, the third contact hole 181 may be formed using a photolithography and etching process.

In one embodiment, the penetration hole 186 of the reflective layer 185 and the contact hole 181 of the planarization layer 180 corresponding thereto can be formed in a square or rectangular shape. A length in at least one dimension of the square or rectangular shape can be about 2 to about 20 μm. However, the present disclosure is not limited thereto. The penetration hole 186 of the reflective layer 185 and the contact hole 181 of the planarization layer 180 corresponding thereto may have various other shapes and sizes, e.g., a circular shape with a diameter of about 2 to about 20 μm. A skilled artisan will appreciate that the shape and size of the penetration hole 186 can be optimized or modified depending on the configuration of the reflective layer 185 as long as it can expose the drain electrode 177 for electrical connection while enhancing the reflection efficiency and minimizing the occurrence of local dark portions.

The interlayer protective layer 188 may be formed of a substantially transparent material. The substantially transparent material can have a transmittance of about 80% or more. The interlayer protective layer 188 may be formed of, for example, silicon oxide, silicon nitride, or nitrification silicon.

The interlayer protective layer 188 can have a thickness which provides insulation between the first electrode 710 and the reflective layer 185 with no electrical short therebetween, particularly around the penetration hole 186. In addition, in order to have a suitable light efficiency, the thickness of the interlayer protective layer 188 can be selected so as not to absorb and/or scatter too much of light that passes therethrough. Further, the thickness of the interlayer protective layer 188 can be selected such that the profile of the organic light emitting display 100 is not too thick. In one embodiment, the interlayer protective layer 188 can have a thickness of about 200 to about 2000 Å.

As described above, the first electrode 710 is formed on the interlayer protective layer 188. The first electrode 710 is connected to the drain electrode 177 through the penetration hole 186 of the reflective layer 185 and the third contact hole 181 of the planarization layer 180. The first electrode 710 is formed to be isolated from those of adjoining pixels.

A pixel definition layer 190 for covering the first electrode 710 is formed on the interlayer protective layer 188. The pixel definition layer 190 has an opening (not shown) for exposing at least part of the first electrode 710. An organic layer 720 may be formed on the first electrode 710 within the opening. Further, a second electrode 730 may be formed on the pixel definition layer 190 and the organic layer 720.

The first electrode 710 and the second electrode 730 may be formed of a transparent conductive material. Examples of the transparent conductive material include, but are not limited to, indium tin oxide (ITO), indium zinc oxide (IZO), zinc oxide (ZnO), and $In_2O_3$ (indium oxide).

As shown in FIG. 2, the first electrode 710, the organic layer 720, and the second electrode 730 form an OLED, which is the light emitting element 70. The organic layer 720 may include a low molecular weight organic material or a polymeric material. The organic layer 720 includes an organic emission layer, and may further include at least one of a hole-injection layer (HIL), a hole-transporting layer (HTL), a hole blocking layer, an electron-transporting layer (ETL), an electron-injection layer (EIL), an electron blocking layer (EBL) that are stacked over or under the organic emission layer, depending on the material used for the organic emission layer.

Although not shown in FIG. 2, an encapsulating member may be further formed over the second electrode 730.

The configuration of the reflective layer 185 described above can maximize the area of the reflective layer 185, thereby improving reflection efficiency. Further, in forming the reflective layer 185, because only a small portion of the reflective layer 185 is etched away for forming the penetration hole 186, the occurrence of impurities can be minimized during the etching process of the reflective layer 185. Therefore, deterioration of reflection efficiency and the occurrence of local dark portions due to impurities can be minimized or prevented.

While the first electrode 710 is etched to be partitioned for individual pixels, the reflective layer 185 is not etched except for some small portions for the penetration holes 186. Therefore, in the process of etching the reflective layer 185 formed of a material such as silver (Ag), the occurrence of impurities can be minimized.

Further, the reflective layer 185 and the first electrode 710 are separated by the interlayer protective layer. Because the two conductive layers 185, 170 formed of different materials are bonded to each other, an adhesion problem and a contact resistance problem may occur when the layers are stacked directly on each other. These problems can be prevented by the intervening interlayer protective layer.

While this disclosure has been described in connection with what is presently considered to be exemplary embodiments, it is to be understood that the disclosure is not limited to the embodiments, but, on the contrary, is intended to cover various modifications and equivalent arrangements included within the spirit and scope of the appended claims.

What is claimed is:

1. An organic light emitting display, comprising:
   a substrate; and
   a plurality of pixels formed over the substrate,
   wherein at least one of the pixels comprises:
      a thin film transistor;
      a light emitting element that is electrically connected to the thin film transistor via a contact in a contact hole; and
      a reflective layer that is interposed between the thin film transistor and the light emitting element, the reflective layer being insulated from each of the thin film transistor and the light emitting element, wherein the contact extends through the reflective layer.

2. The organic light emitting display of claim 1, wherein the reflective layer comprises a penetration hole formed therethrough, and
   wherein the thin film transistor and the light emitting element are electrically connected to each other through the penetration hole of the reflective layer.

3. The organic light emitting display of claim 2, wherein the reflective layer substantially continuously covers substantially the entire portion of the substrate.

4. The organic light emitting display of claim 2, wherein the penetration hole of the reflective layer has a circular shape with a diameter of about 2 to about 20 μm.

5. The organic light emitting display of claim 2, wherein the penetration hole of the reflective layer has a square or rectangular shape, and wherein a length in at least one dimension of the shape is about 2 to about 20 μm.

6. The organic light emitting display of claim 1, wherein the reflective layer comprises silver (Ag).

7. The organic light emitting display of claim 1, further comprising:
   a planarization layer interposed between the thin film transistor and the reflective layer, and
   an interlayer protective layer interposed between the reflective layer and the light emitting element.

8. The organic light emitting display of claim 7, wherein the interlayer protective layer has a transmittance of about 80% or more with respect to visible light.

9. The organic light emitting display of claim 7, wherein the interlayer protective layer has a thickness of about 200 to about 2000 Å.

10. An organic light emitting display comprising:
    a substrate;
    a plurality of pixels on the substrate;
    a thin film transistor formed over the substrate, the thin film transistor comprising a source, a drain, and a gate;
    an interlayer insulating layer formed over the thin film transistor;

a source electrode and a drain electrode formed over the interlayer insulating layer, the source electrode and the drain electrode being electrically connected to the source and the drain, respectively, through the interlayer insulating layer, a planarization layer formed over the interlayer insulating layer such that the source electrode and the drain electrode are interposed between the planarization layer and the interlayer insulating layer;

a reflective layer formed over the planarization layer;

a first electrode formed over the reflective layer, the first electrode being electrically connected to the drain electrode with a contact extending through the planarization layer and the reflective layer;

a pixel definition layer formed over an interlayer protective layer, the pixel definition layer including an opening for exposing the first electrode;

an organic light-emitting layer formed over the first electrode within the opening; and a second electrode formed over the pixel definition layer and the organic light-emitting layer, wherein the interlayer protective layer is interposed between the reflective layer and the first electrode such that the reflective layer is electrically isolated from the first electrode.

11. The organic light emitting display of claim 10, wherein the reflective layer covers substantially the entire portion of the planarization layer.

12. The organic light emitting display of claim 10, wherein the reflective layer includes a penetration hole such that the first electrode is electrically connected to the drain electrode.

13. The organic light emitting display of claim 12, wherein the penetration hole has a circular shape with a diameter of about 2 to about 20 μm.

14. The organic light emitting display of claim 12, wherein the penetration hole has a square or rectangular shape with a length in at least one dimension of about 2 to about 20 μm.

15. The organic light emitting display of claim 10, wherein the reflective layer comprises silver (Ag).

16. The organic light emitting display of claim 10, wherein the interlayer protective layer has a transmittance of about 80% or more with respect to visible light.

17. The organic light emitting display of claim 10, wherein the interlayer protective layer has a thickness of about 200 to about 2000 Å.

18. The organic light emitting display of claim 10, wherein the reflective layer substantially continuously covers the planarization layer without being partitioned.

19. The organic light emitting display of claim 1, wherein the reflective layer overlaps the thin film transistor.

20. The organic light emitting display of claim 10, wherein the reflective layer overlaps the thin film transistor.

* * * * *